United States Patent
Chen et al.

(10) Patent No.: US 9,823,272 B2
(45) Date of Patent: Nov. 21, 2017

(54) WAFER TESTING PROBE CARD

(71) Applicant: MPI Corporation, Hsinchu County (TW)

(72) Inventors: Ming-Chi Chen, Hsinchu County (TW); Tien-Chia Li, Hsinchu County (TW); Dai-Jin Yeh, Hsinchu County (TW); Tsung-Yi Chen, Hsinchu County (TW); Chien-Kuei Wang, Hsinchu County (TW)

(73) Assignee: MPI Corporation, Hsinchu County (TW)

( * ) Notice: Subject to any disclaimer, the term of this patent is extended or adjusted under 35 U.S.C. 154(b) by 363 days.

(21) Appl. No.: 14/162,766

(22) Filed: Jan. 24, 2014

(65) Prior Publication Data

US 2014/0210505 A1   Jul. 31, 2014

(30) Foreign Application Priority Data

Jan. 28, 2013   (TW) ................................ 102103152 A

(51) Int. Cl.
*G01R 31/02* (2006.01)
*G01R 1/073* (2006.01)
*G01R 1/067* (2006.01)

(52) U.S. Cl.
CPC ........ *G01R 1/0735* (2013.01); *G01R 1/06733* (2013.01); *G01R 1/07314* (2013.01)

(58) Field of Classification Search
CPC ................. G01R 31/02; G01R 1/073
USPC ................. 324/754, 756.03, 758, 761, 762
See application file for complete search history.

(56) References Cited

U.S. PATENT DOCUMENTS

| | | | |
|---|---|---|---|
| 2005/0035775 A1* | 2/2005 | Zhou ................. | G01R 1/06716 324/755.08 |
| 2006/0125501 A1* | 6/2006 | Liu ..................... | G01R 31/2889 324/750.25 |
| 2007/0108996 A1* | 5/2007 | Amemiya .......... | G01R 1/07371 324/750.25 |
| 2007/0152689 A1* | 7/2007 | Lee .................... | G01R 1/07378 324/754.18 |
| 2007/0182431 A1* | 8/2007 | Komatsu ............ | G01R 1/07307 324/756.03 |
| 2010/0001752 A1* | 1/2010 | Yamada ............. | G01R 31/2891 324/756.01 |
| 2012/0319711 A1* | 12/2012 | Hung ................. | G01R 1/07371 324/750.16 |

FOREIGN PATENT DOCUMENTS

| | | |
|---|---|---|
| CN | 101036060 B | 1/2011 |
| CN | 202102019 U | 1/2012 |
| TW | 590220 | 6/2004 |

* cited by examiner

*Primary Examiner* — Arleen M Vazquez
*Assistant Examiner* — Neel Shah
(74) *Attorney, Agent, or Firm* — CKC & Partners Co., Ltd.

(57) ABSTRACT

A wafer testing probe card includes a printed circuit board, a flexible circuit board, an elastic piece, and a probe unit. The flexible circuit board is electrically connected to the printed circuit board. The elastic piece is disposed between the printed circuit board and the flexible circuit board. The probe unit includes a probe head and a plurality of probes. The probe head is fixed on the printed circuit board and has a plurality of through holes. The probes respectively pass through the through holes and move up and down relative to the probe head.

16 Claims, 7 Drawing Sheets

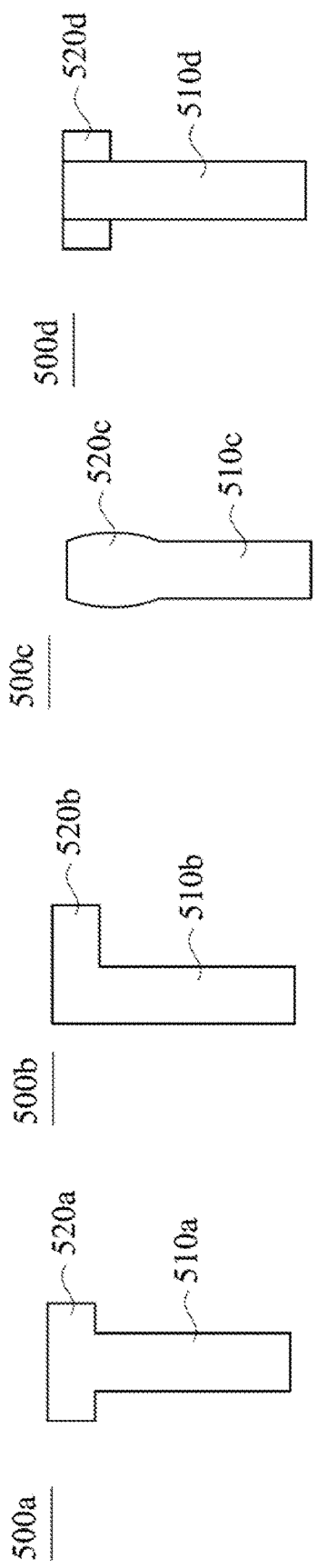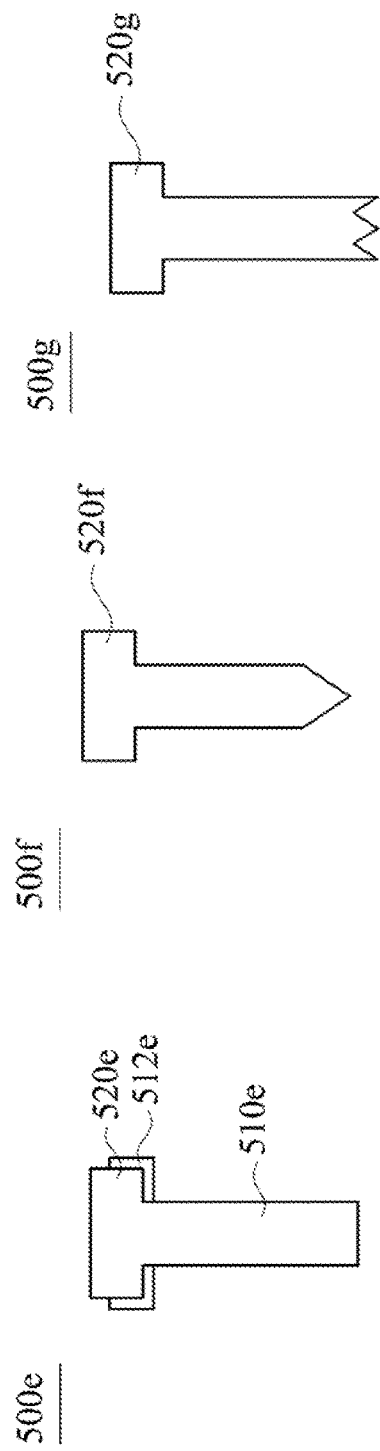

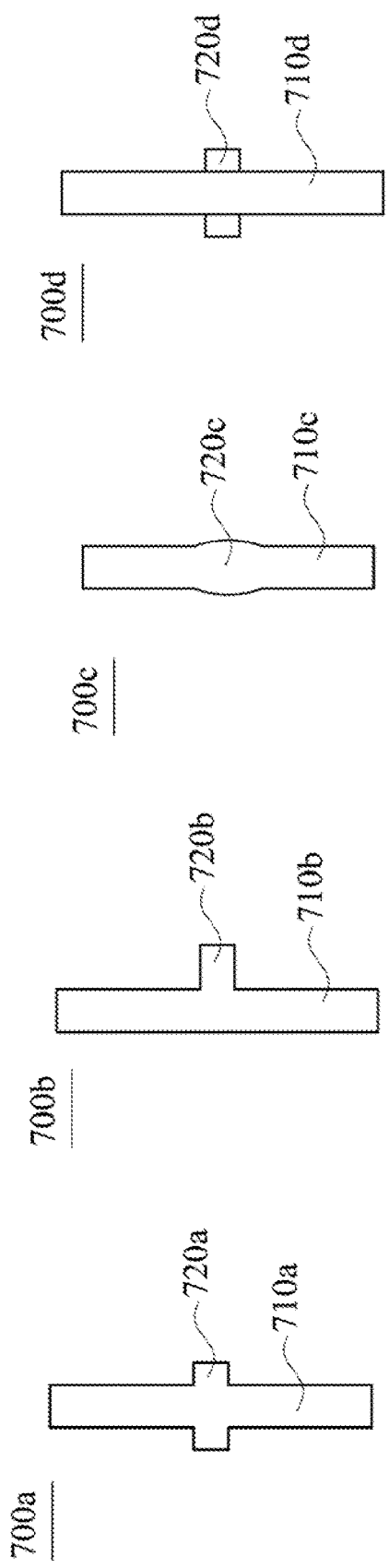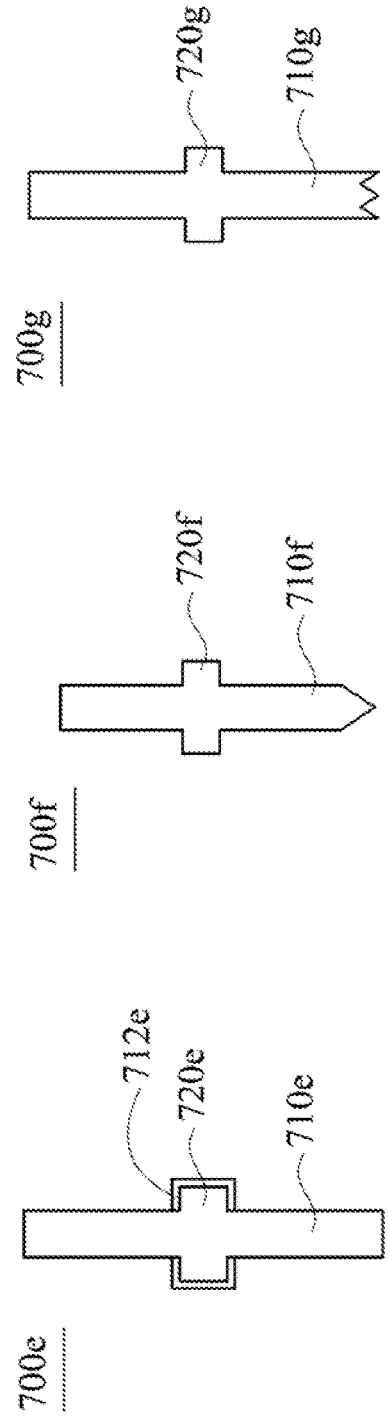

WAFER TESTING PROBE CARD

RELATED APPLICATIONS

This application claims priority to Taiwan Application Serial Number 102103152, filed Jan. 28, 2013, which are herein incorporated by reference.

BACKGROUND

In processes of integrated circuits, tests are performed in different product stages of the processes. Accurate analysis instruments are used to conduct quality controls in the whole processes, so as to ensure chip quality and process yield and to locate the occurrences of flaws of integrated circuits in the processes. Then, the reasons behind the occurrences of flaws are found, such that product quality is ensured to meet the standard and the process yield. Therefore, in the processes of integrated circuits, the testing is an important step to enhance the product yield of integrated circuits and to accumulate effective data for engineering analysis.

In fine-pitch tests of integrated circuits, compared to traditional test methods such pogo pins or needle probes, the film probe method has a better accuracy and a lower cost. However, concerning the existing film probe card, if anyone of the probe is worn or detached, the whole film probe card can be used no more, resulting in a lower test efficiency and a higher cost.

SUMMARY

This disclosure provides a wafer testing probe card.

In one embodiment, a wafer testing probe card is provided. The wafer testing probe card includes a printed circuit board, a flexible circuit board, an elastic piece, and a probe unit. The flexible circuit board is electrically connected to the printed circuit board. The elastic piece is disposed between the printed circuit board and the flexible circuit board. The probe unit includes a probe head and a plurality of probes. The probe head is fixed on the printed circuit board and has a plurality of through holes. The probes respectively pass through the through holes, and the probes move up and down relative to the probe head.

Because the probes respectively pass through the through holes, the probes may be replaced respectively, so as to lower costs and fix easily.

Moreover, because the probes move up and down relative to the probe head, lengths of the probes gradually increase from a periphery of the elastic piece to a center of the elastic piece, or a thickness of the elastic piece gradually increases from the periphery of the elastic piece to the center of the elastic piece, the probes don't need to be deformed, such that the lengths of the probes may be shorter and that transmissions may be faster. In addition, the measurable frequency is increased.

BRIEF DESCRIPTION OF THE DRAWINGS

The invention can be more fully understood by reading the following detailed description of the embodiment, with reference made to the accompanying drawings as follows:

FIG. 5A to FIG. 5G are schematic views of probes according to various embodiments applied to the wafer testing probe card according to the first to the fourth embodiments of this invention;

FIG. 7A to FIG. 7G are schematic views of the probes according to various embodiments applied to the wafer testing probe card according to the fifth embodiments of this invention.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
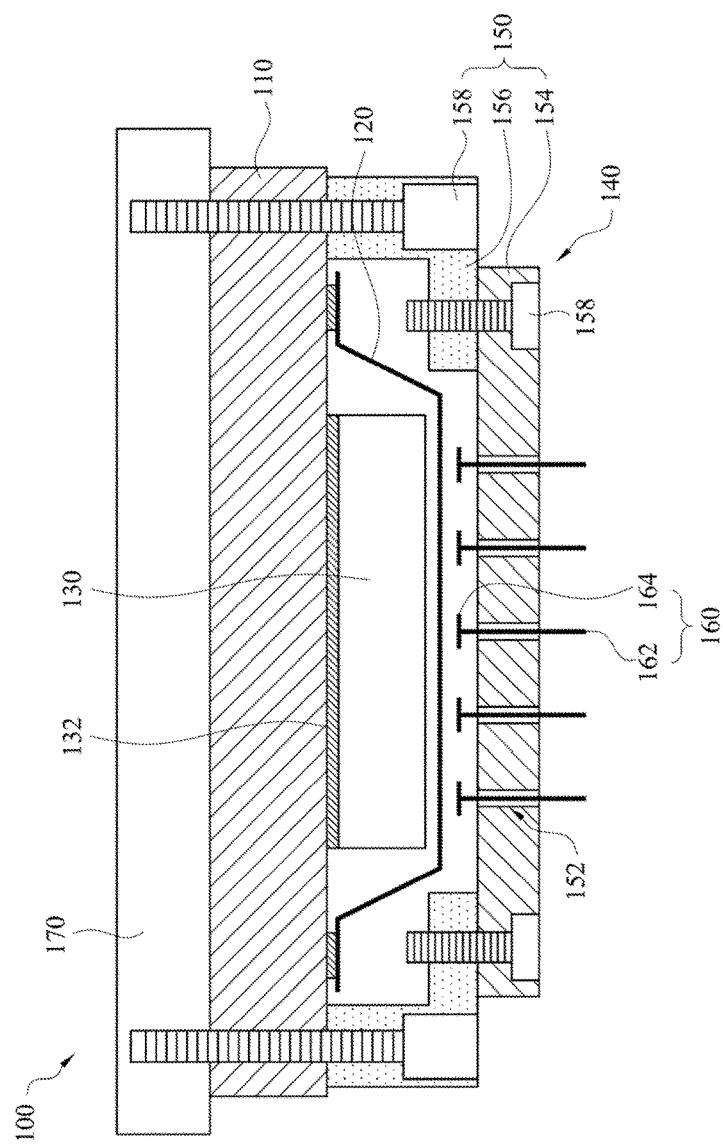
FIG. 1 is a schematic view of a wafer testing probe card according to the first embodiment of this invention.

FIG. 1 is a schematic view of a wafer testing probe card according to the first embodiment of this invention. A wafer testing probe card 100 includes a printed circuit board 110, a flexible circuit board 120, an elastic piece 130, and a probe unit 140. The flexible circuit board 120 is electrically connected to the printed circuit board 110. The elastic piece 130 is disposed between the printed circuit board 110 and the flexible circuit board 120. The probe unit 140 includes a probe head 150 and a plurality of probes 160. The probe head 150 is fixed on the printed circuit board 110 and has a plurality of through holes 152. The probes 160 respectively pass through the through holes 152, and the probes 160 move up and down relative to the probe head 150.

The probe head 150 includes an insulated substrate 154 having the through holes 152, a holder 156 and a plurality of screws 158. The insulated substrate 154 is fixed to the holder 156 via the screws 158. The holder 156 is fixed to the printed circuit board 110 by the screws 158. The holder 156 may pass through the printed circuit board 110 and then be fixed to the support substrate 170, depending on actual needs. The flexible circuit board 120 is fixed to the printed circuit board 110 by fixing methods such as soldering and is electrically connected to the printed circuit board 110.

Each of the probes 160 includes a probe body 162 and a stopper 164 connected to one end of the probe body 162. The stopper 164 is disposed between the flexible circuit board 120 and the insulated substrate 154. An outer diameter of the stopper 164 is larger than an inner diameter of the through hole 152, so as to prevent the probes 160 from being detached from the through holes 152. Because the outer diameter of the probe bodies 162 approximately matches the inner diameter of the through holes 152, the probes 160 may move up and down in the through holes 152 without excessively lateral shift. When the wafer testing probe card 100 is not testing, the probes 160 may contact the flexible circuit board 120 or not. In addition, lengths of the probes 160 may be the same.

The elastic, piece 130 is disposed between the flexible circuit board 120 and the printed circuit board 110. The elastic piece 130 may be fixed to the printed circuit board 110 by an adhesive 132. The probe unit 140 is disposed on the side where the flexible circuit board 120 faces a device under test (DUT). The probes 160 protrude from the probe head 150, for contacting the analyte to perform signal measurements. The probes 160 may be extruded when contacting the analyte, and the probes 160 contact the flexible circuit board 120 by the support of the elastic piece 130, such that signals are transmitted between the flexible circuit board 120 and the analyte through the probe 160. The flexible circuit board 120 may be electronically connected to the printed circuit board 110, such that signals are transmitted between the printed circuit board 110, flexible circuit board 120, the probes 160, and the DUTs.

The probes 160 respectively pass through the through holes 152, and when one of the probes 160 is damaged, only damaged probe 160 may be replaced, without replacing the whole probe unit 140. Therefore, the wafer testing probe card 100 may be repaired easily, and the costs of prepared cards and maintenance are lowered.

In addition, the probes 160 may be low flexible straight needles, that is, the probe bodies 162 are approximately line-shaped and are not easy to be bended. When the probes 160 contact the DUTs, reaction forces imposed on the probes 160 are absorbed by the elastic piece 130. In a conventional probe with a buckling function, because the probe needs to have a contacting function and the buckling function, the probe has a straight portion and a buckling portion for absorbing the reaction forces, so that a length of the probe may not be shortened. Because the function of the probe 160 and the function of the elastic piece 130 are separated in the disclosure, the length of the probe 160 can be shortened. When the length of the probe 160 is shortened, the measurable frequency is increased as well. For example, the probe 160 with full length about 4 mm, the measurable frequency is about 1.2 G Hz to 2.2 G Hz; the probe 160 with full length about 2 mm, the measurable frequency is about 5 G Hz; the probe 160 with full length about 1 mm, the measurable frequency is about 10 G Hz to 15 G Hz. Spaces between the probes 160 (that is also the spaces between the through holes 152) may be shortened to 40 μm. Probe space miniaturization is applied to high intensity chip tests and may enhance the measurable frequency.

Figure 2:
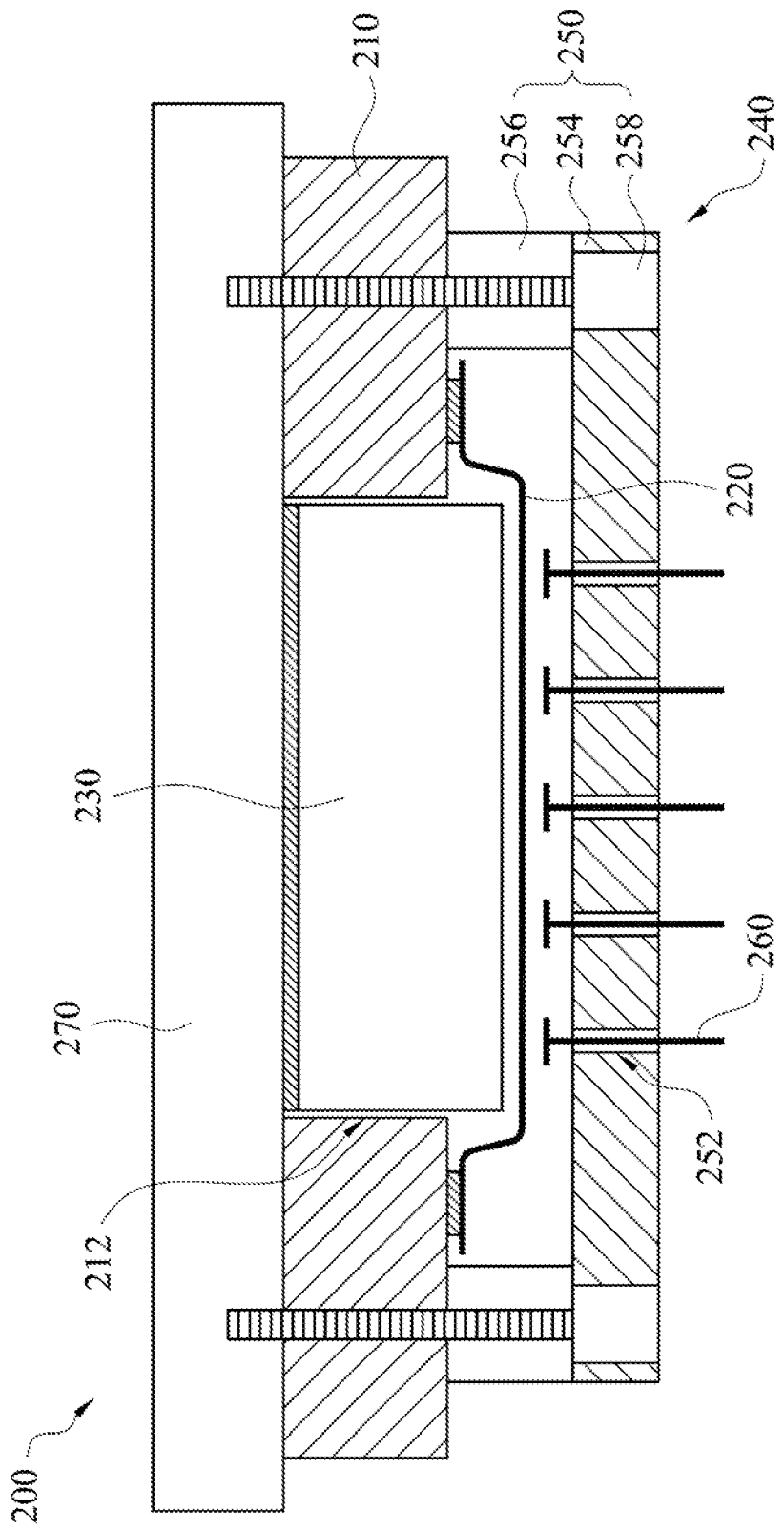
FIG. 2 is a schematic view of the wafer testing probe card according to the second embodiment of this invention.

FIG. 2 is a schematic view of the wafer testing probe card according to the second embodiment of this invention. As shown in FIG. 2, a wafer testing probe card 200 includes a printed circuit board 210, a flexible circuit board 220, an elastic piece 230, and a probe unit 240. The detailed description of the wafer testing probe card 200 is the same as described in the first embodiment.

The difference between the first embodiment and the second embodiment is that the printed circuit board 210 of the second embodiment further includes an opening 212, and the elastic piece 230 is disposed in the opening 212. The flexible circuit board 220 then covers on the elastic piece 230 and is electronically connected to the printed circuit board 210. Compared to the first embodiment, because the elastic piece 230 of the second embodiment is disposed in the printed circuit board 210, a total thickness of the wafer testing probe card 200 is lowered, and the elastic piece 230 is stably fixed. Except that the elastic piece 230 is disposed in the opening 212, the detailed description of the wafer testing probe card 200 is the same as described in the first embodiment.

Figure 3:
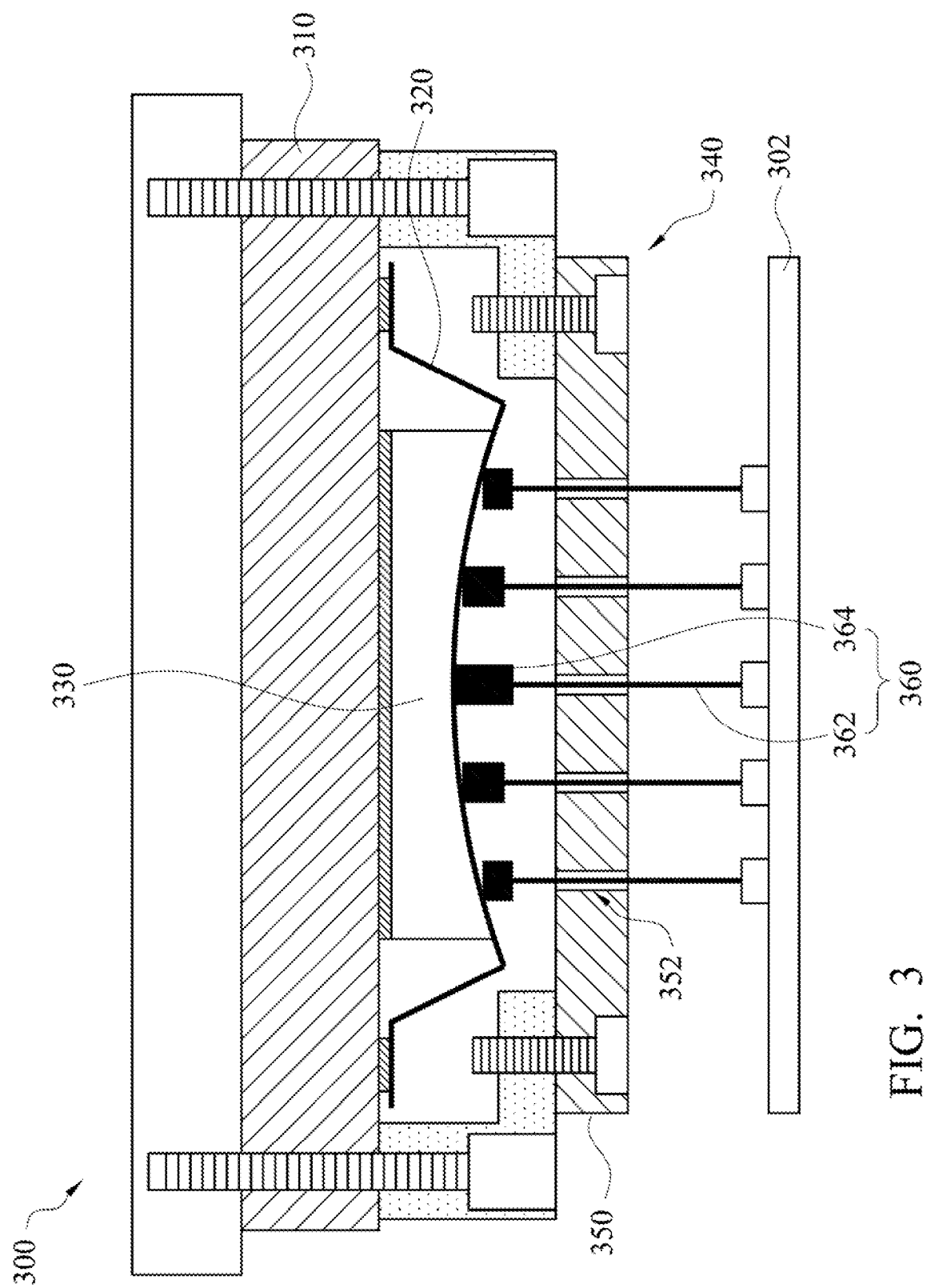
FIG. 3 is a schematic view of the wafer testing probe card according to the third embodiment of this invention.

FIG. 3 is a schematic view of the wafer testing probe card according to the third embodiment of this invention. As shown in FIG. 3, a wafer testing probe card 300 includes a printed circuit board 310, a flexible circuit board 320, an elastic piece 330, and a probe unit 340. The detailed description of the wafer testing probe card 300 is the same as described in the first embodiment and the second embodiment.

As an illustration in the third embodiment, the elastic piece 330 is disposed between the printed circuit board 310 and the flexible circuit board 320. Because spaces between probes 360 are smaller and the probe intensity is higher, the probes 360 withstand the elastic piece 330 in real tests, such that a center area of the elastic piece 330 is depressed due to smaller areas of thrust surface and a concentrated tension.

In view of this, each of the probes 360 includes a probe body 362 and a stopper 364 connected to one end of the probe body 362 and lengths of the stoppers 364 gradually increase from a periphery of the elastic piece 330 to a center of the elastic piece 330. Therefore, when the probes 360 contact a DUT 302, such that the probes 360 contact the flexible circuit board 320 and withstand the elastic piece 330, the depressed deformation in the center area of the elastic piece 330 is compensated due to the greater lengths of the stoppers 330 near the center of the elastic piece 330, such that the probes 360 stably contact and are stably electronically connected to the flexible circuit board 320 and the DUT 302.

To make that the probes 360 stably contact and are stably electronically connected to the flexible circuit board 320 and the DUT 302, in some embodiments, lengths of the probes 360 gradually increase from the periphery of the elastic piece 330 to the center of the elastic piece 330. People having ordinary skill in the art can make proper modification to the probes 360 according to their actual needs.

Figure 4:
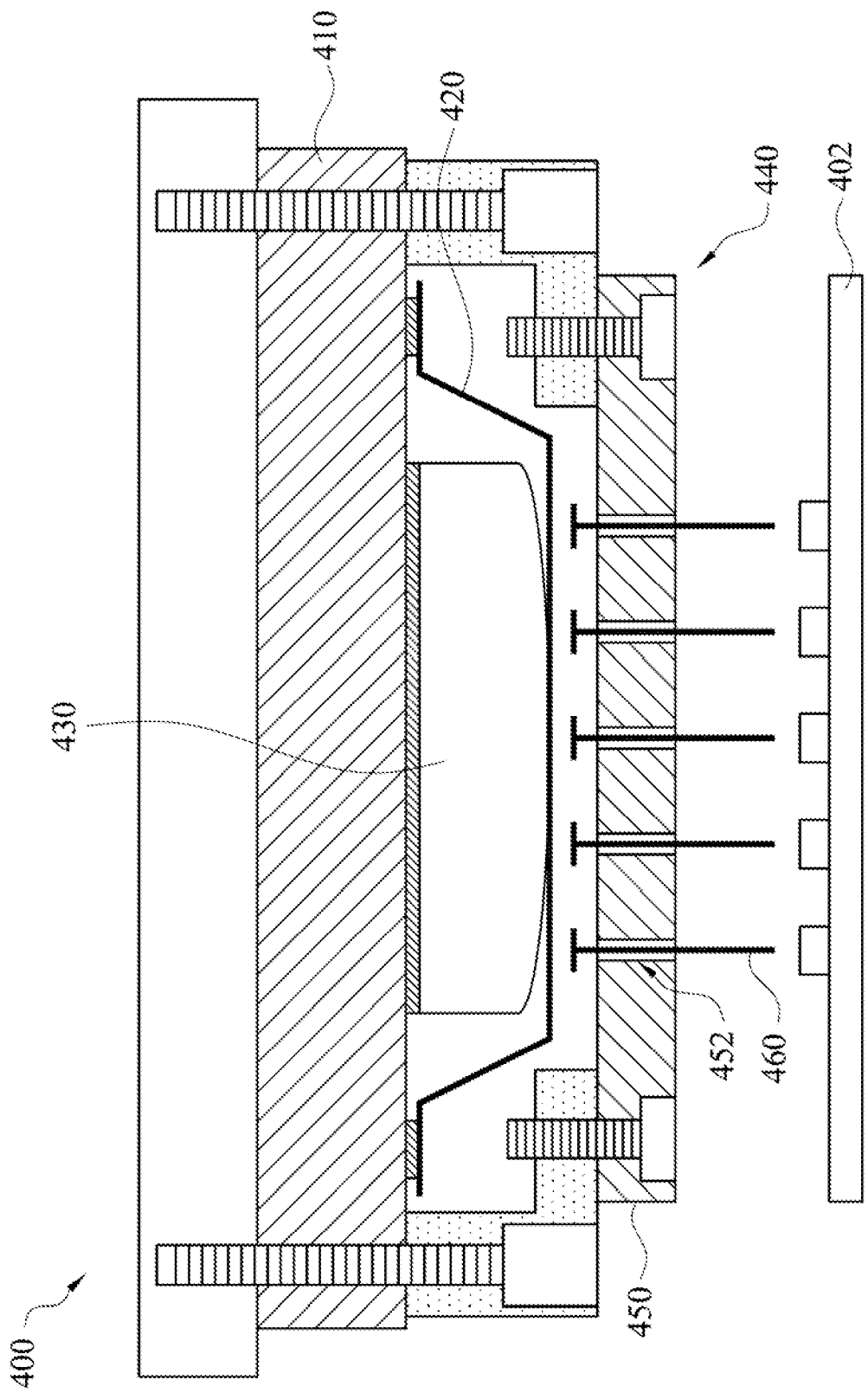
FIG. 4 is a schematic view of the wafer testing probe card according to the fourth embodiment of this invention.

FIG. 4 is a schematic view of the wafer testing probe card according to the fourth embodiment of this invention. As shown in FIG. 4, a wafer testing probe card 400 includes a printed circuit board 410, a flexible circuit board 420, an elastic piece 430, and a probe unit 440. The detailed description of the wafer testing probe card 400 is the same as described in the first embodiment and the second embodiment. As an illustration in the fourth embodiment, the elastic piece 430 is disposed between the printed circuit board 410 and the flexible circuit board 420.

The fourth embodiment provide another solution for a lower test reliability due to a depression of a center area of the elastic piece 430 by smaller areas of thrust surface and a concentrated tension, that is, a thickness of the elastic piece 430 gradually increases from a periphery of the elastic piece 430 to a center of the elastic piece 430. Therefore, when the probes 460 contact a DUT 402, such that the probes 460 contact the flexible circuit board 420 and withstand the elastic piece 430, the depressed deformation in the center area of the elastic piece 430 is compensated due to the greater thickness of the elastic piece 430 near the center of the elastic piece 430, such that the probes 460 stably contact and is stably electronically connected to the flexible circuit board 420 and the DUT 402.

FIG. 5A to FIG. 5G are schematic views of probes according to various embodiments applied to the wafer testing probe card according to the first to the fourth embodiments of this invention. As shown in FIG. 5A to FIG. 5G, probes 500a to 500c include probe bodies 510a to 510c and stoppers 520a to 520c respectively connected to one end of each of the probe bodies 510a to 510c, and the probe bodies 510a to 510c and the stopper 520a to 520c may be integrally formed, which means materials of the probe bodies and the stoppers are both conductors. A width of the stopper 520a to 520c is larger than a width of the probe bodies 510a to 510c. In addition, ends for contacting DUTs of the probe bodies 510a to 510c may be planar. As shown in FIG. 5A, the stopper 520a may evenly protrude from the probe body 510a, such that the sectional shape of the probe 500a is similar to a T-shape. As shown in FIG. 5B, the stopper 520b may protrude from the probe body 510b, such that the sectional shape of the probe 500b is similar to an inverted L-shape. As shown in FIG. 5C, the shape of the stopper 520c may be similar to a ball shape with a planar top surface. The stopper 520a to 520c may be used for preventing the probes 500a to 500c from being detached from the through holes.

As shown in FIG. 5D, a width of the stopper 520d is larger than a width of the probe body 510d. The probe body 510d has a uniform diameter, and the material of the probe body 510d is a conductor. The stopper 520d is formed and surrounds one end of the probe body 510d, and the material of the stopper 520d is a nonconductor. The stopper 520d evenly protrudes the probe body 510d, such that the sectional shape is similar to a T-shape. To effectively perform tests, two ends of the probe body 510d both need to be exposed from the stopper 520d. As shown in FIG. 5E, the probe body 510e and the stopper 520e may be conductors, and an insulation layer 512e is formed around a part of an edge of the stopper 520e.

In addition to prevent the probes 500d to 500e from being detached from the through holes, the stopper 520d to 520e are electronically isolated from the neighboring probes 500d to 500e by the stopper 520d to 520e with an isolation function, so as to prevent the probes 500d to 500e from short circuit due to direct contact.

One end for contacting the DUTs of each of aforementioned probes 500a to 500e, that is, one end of each of the aforementioned probe bodies 510a to 510e, may be planar. As shown in FIG. 5F, an end of the probe 500f may be pin-shaped. As shown in FIG. 5G, an end of probe 500g may be crown-shaped or serrated.

The aforementioned probes 500a to 500g may be applied to the first to fourth embodiments according to actual needs, so as to easily assembly or to reach effects such as fewer assembly components.

Figure 6:
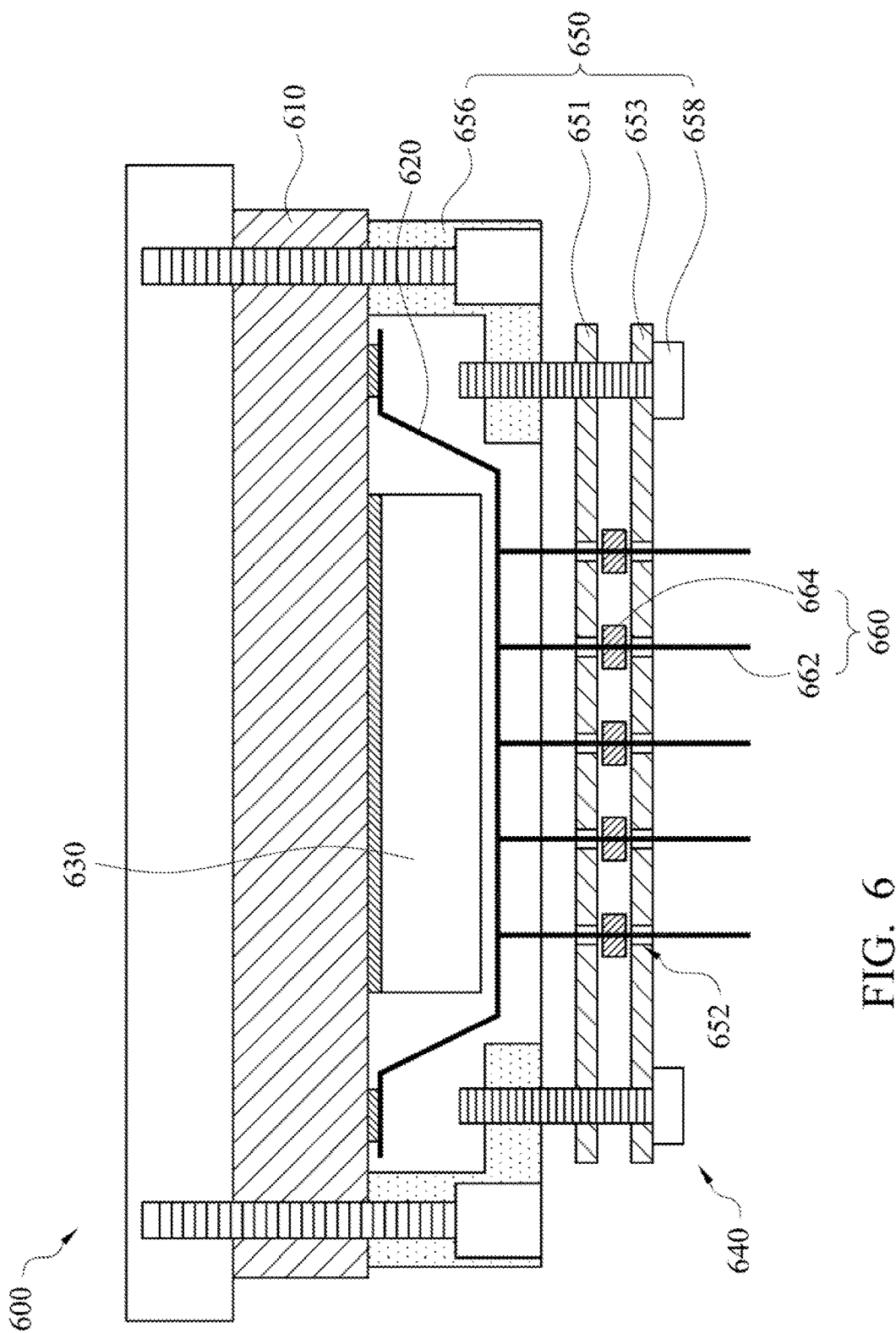
FIG. 6 is a schematic view of the wafer testing probe card according to the fifth embodiment of this invention.

FIG. 6 is a schematic view of a wafer testing probe card according to the fifth embodiment of this invention. As shown in FIG. 6, a wafer testing probe card 600 includes a printed circuit board 610, a flexible circuit board 620, an elastic piece 630, and a probe unit 640. The detailed description of the wafer testing probe card 600 is the same as described in the first embodiment and the second embodiment. As an illustration in the fifth embodiment, the elastic piece 630 is disposed between the printed circuit board 610 and the flexible circuit board 620.

The difference between the fifth embodiment and the first to fourth embodiments includes an upper insulated substrate 651, a lower insulated substrate 653, probe bodies 662, and stoppers 664 respectively disposed on the middle sections of the probe bodies 662. The probe head 650 includes the upper insulated substrate 651 having the through holes 652, the lower insulated substrate 653 having the through holes 652, a holder 656, and screws 658. When the probe bodies 662 are assembled into the probe head 650, the stoppers 664 are respectively disposed between the upper insulated substrate 651 and the lower insulated substrate 653. An outer diameter of the stopper 664 is larger than an inner diameter of the through holes 652, so as to prevent the probes 660 from being detached from the through holes 652.

Because the stoppers 664 are disposed between the upper insulated substrate 651 and the lower insulated substrate 653, the probes 600 and the DUT stably contact each other, and the stress is more concentrated. When a damaged probe 660 is replaced, in a process of removing the probe unit 640, the probes 660 are gripped and fixed by the upper insulated substrate 651 and the lower insulated substrate 653, so as to prevent the probes 660 from being detached. Therefore, the replacing becomes easier.

FIG. 7A to FIG. 7G are schematic views of probes according to various embodiments applied to the wafer testing probe card according to the fifth embodiments of this invention. As shown in FIG. 7A to FIG. 7G, except that the stoppers 720a to 720g are disposed on the middle sections of the probe bodies 710a to 710g, all other features are disclosed in the probes 500a to 500g.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

What is claimed is:

1. A wafer testing probe card, comprising:
   a printed circuit board;
   a flexible circuit board having peripheral portions electrically connected to the printed circuit board and collectively defining an accommodation space, and the flexible circuit board having an upper surface and a lower surface;
   an elastic piece disposed within the accommodation space defined collectively by the printed circuit board and the flexible circuit board; and
   a probe unit, comprising:
      a probe head fixed on the printed circuit board and having a plurality of through holes; and
      a plurality of probes respectively passing through the through holes, wherein the probes in direct contact with the lower surface of the flexible circuit board with the support of the elastic piece against the upper surface of the flexible circuit board when the probes moves toward the flexible circuit board, thereby enabling signals to be transmitted from a device under test to the printed circuit board via the flexible circuit board and the probes; wherein
   as the probes moves toward the flexible circuit board, the elastic piece absorbs the forces of the probes transmitted through the flexible circuit board; and
   the elastic piece and the probes are physically spaced from each other by the flexible circuit board such that the elastic piece is incapable of contacting the probes.

2. The wafer testing probe card of claim 1, wherein lengths of the probes are the same.

3. The wafer testing probe card of claim 1, wherein lengths of the probes gradually increase from a periphery of the elastic piece to a center of the elastic piece.

4. The wafer testing probe card of claim 1, wherein a thickness of the elastic piece gradually increases from a periphery of the elastic piece to a center of the elastic piece.

5. The wafer testing probe card of claim 1, wherein the probe head comprises a holder and a plurality of screws, wherein the holder is fixed to the printed circuit board by the screws.

6. The wafer testing probe card of claim 1, wherein the probe head comprises an insulated substrate having the through holes.

7. The wafer testing probe card of claim 6, wherein each of the probes comprises a probe body and a stopper connected to one end of the probe body, wherein the stopper is disposed between the flexible circuit board and the insulated substrate, and an outer diameter of the stopper is larger than an inner diameter of the through holes, so as to prevent the probes from being detached from the through holes.

8. The wafer testing probe card of claim 7, wherein lengths of the stoppers gradually increase from a periphery of the elastic piece to a center of the elastic piece.

9. The wafer testing probe card of claim 7, wherein materials of the probe bodies and the stoppers are conductors.

10. The wafer testing probe card of claim 7, wherein materials of the probe bodies are conductors, materials of the stoppers are nonconductors, and two ends of the probe bodies are both exposed from the stoppers.

11. The wafer testing probe card of claim 1, wherein the probe head comprises an upper insulated substrate having the through holes and a lower insulated substrate having the through holes.

12. The wafer testing probe card of claim 11, wherein each of the probes comprises a probe body and a stopper disposed on a middle section of the probe body, wherein the stopper is disposed between the upper insulated substrate and the lower insulated substrate, and an outer diameter of the stopper is larger than an inner diameter of the through holes, so as to prevent the probes from being detached from the through holes.

13. The wafer testing probe card of claim 12, wherein materials of the probe bodies and the stoppers are conductors.

14. The wafer testing probe card of claim 12, wherein materials of the probe bodies are conductors, materials of the stoppers are nonconductors, and two ends of the probe bodies are both exposed from the stoppers.

15. The wafer testing probe card of claim 1, wherein the probes are straight needles.

16. The wafer testing probe card of claim 1, wherein the printed circuit board includes an opening, and the elastic piece is disposed in the opening.

\* \* \* \* \*